United States Patent [19]

Sheldon et al.

[11] 3,852,876

[45] Dec. 10, 1974

[54] HIGH VOLTAGE POWER TRANSISTOR AND METHOD FOR MAKING

[75] Inventors: Gary S. Sheldon, Union Springs; Peter S. Shen, Auburn, both of N.Y.

[73] Assignee: General Electric Company, Syracuse, N.Y.

[22] Filed: Oct. 5, 1973

[21] Appl. No.: 403,949

Related U.S. Application Data

[62] Division of Ser. No. 320,313, Jan. 2, 1973.

[52] U.S. Cl. ..................................... 29/583, 29/580

[51] Int. Cl. ............................................. B01j 17/00

[58] Field of Search .................... 29/580, 576 J, 583

[56] References Cited

UNITED STATES PATENTS

| | | | |
|---|---|---|---|
| 3,369,290 | 2/1968 | Mayer | 29/576 J |
| 3,416,224 | 12/1968 | Armstrong | 29/580 |
| 3,579,815 | 5/1971 | Gentry | 29/580 |

*Primary Examiner*—Roy Lake

*Assistant Examiner*—W. Tupman

*Attorney, Agent, or Firm*—Robert J. Mooney

[57] ABSTRACT

High voltage power transistor and method for making in which a first or junction wafer, containing inner and outer collector layers surmounted by a base layer topped by spaced emitter regions, is bonded to a reinforcing substrate or carrier wafer, preferably with a metallic alloy bond. The junction wafer is then grooved between emitter regions to form mesas each containing a transistor collector, base, and emitter region, the grooves extending almost entirely through the lowermost collector layer but the carrier wafer preventing the junction wafer from collapsing. While supporting the grooved junction wafer by means of the carrier wafer, the sidewalls and bottoms of the grooves are simultaneously coated with a glass passivant, and the bonded wafers are then subdivided at the grooves to form a plurality of individual transistors.

6 Claims, 8 Drawing Figures

HIGH VOLTAGE POWER TRANSISTOR AND METHOD FOR MAKING

This is a division, of application Ser. No. 320,313 filed Jan. 2, 1973.

This invention relates to improvements in power transistors of the passivated mesa high voltage type, and to an improved method of making such power transistors.

Though it has heretofore been known how to produce semiconductor devices having P/N junctions capable of blocking high voltages of 1,400 volts or more, such techniques usually involve individualized treatment of the junctions and separate processing and handling of individual devices to an extent incompatible with the economics and extreme cost competitiveness of high voltage power transistors for modern consumer and industrial applications.

Accordingly, one object of the present invention is to provide an improved power transistor manufacturing process, for making improved power transistors of the passivated mesa type, which is particularly suitable for simultaneous fabrication of many such transistors from a unitary relatively thin semiconductor wafer of very large major face dimension, such as a diameter of 2 inches or more providing a wafer diameter-to-thickness ratio of as much as 200:1 or more.

Another object is to provide a manufacturing process by which power transistors of the foregoing character and having superior voltage blocking characteristics are obtained at desirably low unit cost.

Another object is to provide an improved power transistor and manufacturing process of the foregoing character, in which glass is utilized as the passivant for the collector and base sidewalls and collector-base P/N junctions, and wherein such glass is applied simultaneously to all of the transistor dice or pellets formed in an individual wafer before the wafer is subdivided into the individual pellets constituting the semiconductor bodies of individual transistors.

Another object is to provide an improved power transistor manufacturing process of the foregoing character in which the individual dice or pellets constituting the semiconductor bodies of individual transistors may be economically electrically tested, measured, characterized, and the like, prior to their subdivision from their parent wafer.

Another object is to provide improved power transistors of the foregoing character which are particularly suitable for high-volume manufacture at low cost with low direct labor content and high yields, yet exhibit superior collector-base breakdown voltages of up to 1,400 volts or more.

Another object is to provide an improved process for simultaneously fabricating silicon power transistors of the foregoing character from a relatively thin unitary silicon wafer of relatively very large diameter or equivalent major face dimension, and in which wafer damage and resulting yield loss during processing and handling is minimized.

Figure 1:
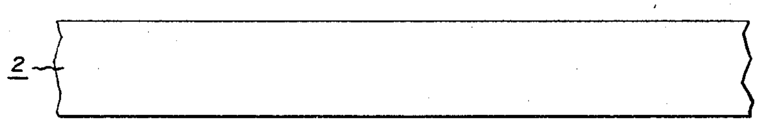
Figure 2:
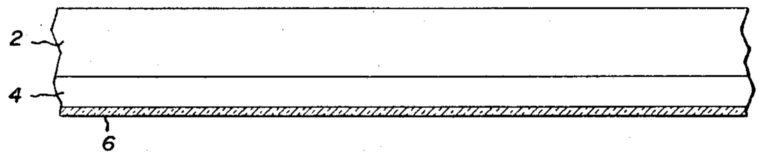
Figure 3:
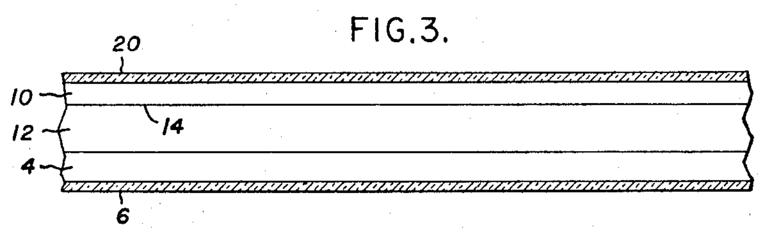
Figure 4:
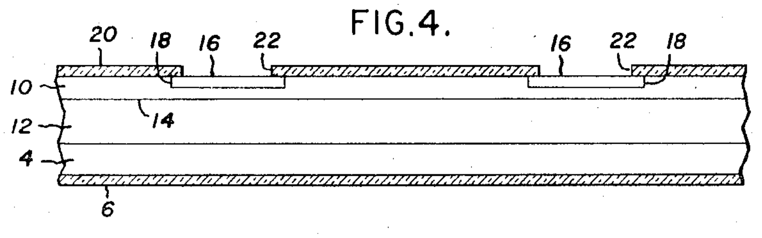
Figure 5:
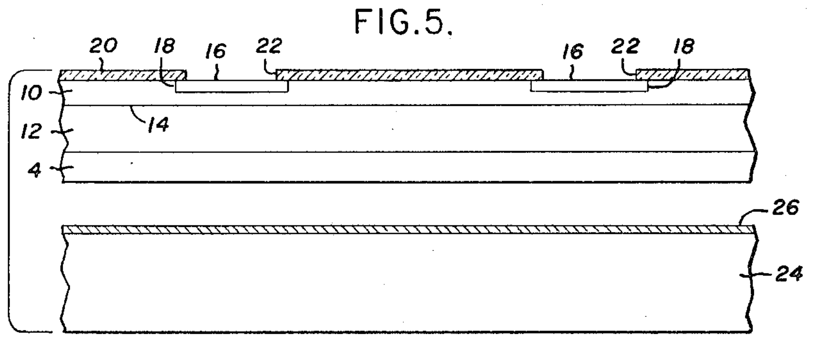
Figure 6:
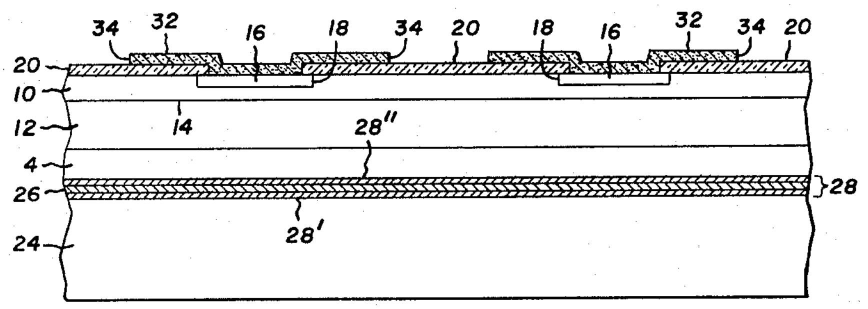
Figure 7:
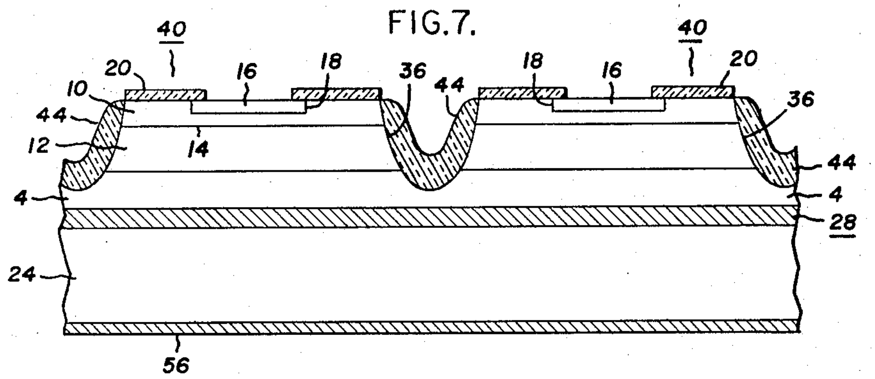
Figure 8:
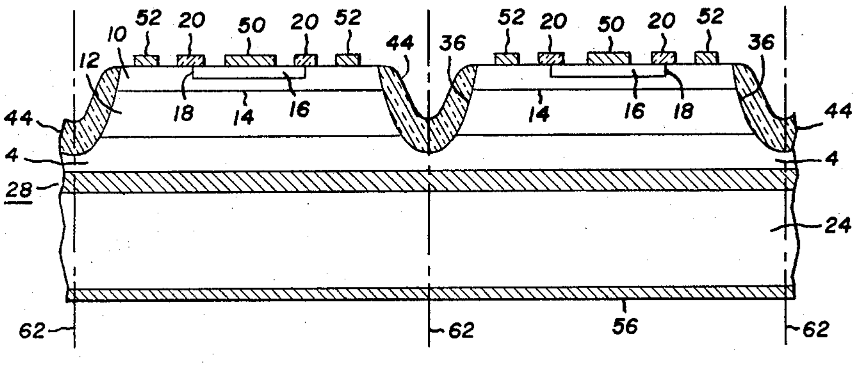

These and other objects of the present invention will be apparent from the following description and the accompanying drawings, wherein:

FIG. 1 is an enlarged fragmentary sectional view of a portion of one form of semiconductor wafer which is suitable for serving as the starting material for manufacture of transistors according to the present invention;

FIGS. 2, 3, and 4 are views similar to FIG. 1 showing successive intermediate stages in the process of manufacturing transistors according to the present invention;

FIG. 5 is a view similar to FIG. 4 showing a still later intermediate stage in the process of manufacturing transistors according to the present invention; and FIGS. 6, 7, and 8 are views similar to FIG. 5 and showing successive further steps in the manufacturing process of the present invention.

Referring to FIG. 1 of the drawing, suitable starting material for power transistors constructed according to the present invention consists of a wafer 2 of semiconductor material such as monocrystalline silicon, of either the floating zone or czochralski growth type, and of either N type impurity for the manufacture of NPN transistors or P type impurity for the manufacture of PNP transistors. By way of example, the detailed description to follow relates to the manufacture of transistors of the NPN type, and hence wafer 2 is shown as of the N type. Wafer 2 may have a thickness of, for example, about 10 mils (i.e., 0.010 inches), and a diameter of, for example, 2 to 3 inches. This starting wafer 2 is hereinafter occasionally referred to as a junction wafer, in that it is intended to contain ultimately the respective P/N junctions of a plurality of individual transistors to be formed in it and subdivided from it. The junction wafer 2 may have a starting resistivity of, for example, preferably about 50 to 100 ohm cm.

In the manufacture of transistors according to the invention, after lapping and cleaning in accordance with techniques well known to those skilled in the art, wafer 2 is diffused with a suitable N type impurity such as phosphorus to form an N+ outer collector layer 4 at one of its major faces. During the formation of N+ layer 4, it may become coated by a thin layer of silicon dioxide, shown in the drawing as layer 6.

To preclude undesired distortion of the diffusion wafer 2 by warping or the like, a symmetrical second N+ layer, not shown, equivalent to layer 4, may be formed simultaneously in the major face of the wafer remote from layer 4, after which the second N+ layer may be removed, for example, by lapping, leaving N+ layer 4 in place. As will become more apparent hereinafter, N+ layer 4 is intended to provide a relatively low resistivity region constituting part of the total thickness of the collector portion of each finished transistor to be derived ultimately by the subdivision of wafer 2. The upper limit to the thickness of layer 4 is determined by considerations of the extent to which it undesirably increases the collector saturation voltage of the transistors, as well as how deeply it can be diffused, which as a practical matter is no more than about 4 mils. Layer 4 therefore preferably has a thickness of about 2 to 3 mils and a net impurity concentration at its exposed surface, which is the bottom major face of wafer 2, of about $10^{19}$ impurity atoms/cc.

To provide the base region for each of the respective transistors to be derived ultimately from wafer 2, a layer 10 of relatively high impurity concentration, and of opposite conductivity type to that of wafer 2, is next formed in the major face of wafer 2 remote from layer 4. When wafer 2 is of N type as shown, layer 10 may be formed, for example, by diffusion of a suitable P type impurity such as boron into the exposed face of wafer 2. The P+ layer 10 has a thickness of preferably about 1.0 to 1.5 mils, and a surface net impurity concentration of about $10^{18}$ impurity atoms/cc. The portion of layer 2 between outer collector layer 4 and base layer 10 constitutes an inner collector layer 12, and forms with base layer 10 a collector-base P/N junction 14. The spacing between outer collector layer 4 and base layer 10 is made such that inner collector layer 12 is just thick enough to support the required collector voltage and the corresponding spread of space charge therein, while avoiding both an objectionable increase in transistor $V_{CE_{SAT}}$ and an objectionable decrease in current handling ability of the transistors to be derived from wafer 2.

Suitable emitter regions 16 for the respective transistors, of opposite conductivity type to base layer 10 and forming emitter-base P/N junctions 18 therewith, are then formed in the exposed surface portion of layer 10, for example by provision of a conventional oxide mask 20 as best shown in FIG. 4, followed by photolithographic formation of impurity exposure windows 22 in the mask 20, and impurity diffusion through the mask windows, all of which techniques are well known to those skilled in the art. The thickness, i.e., depth, of the emitter regions 16 is preferably about 0.6 mils, while the emitter center-to-center spacing in wafer 2 is dependent on the size and current rating of the transistors to be derived from wafer 2, and may be, for example, 180 mils for transistors of 5 ampere collector-current, 1,400 volt $V_{CBO}$ rating. Though not evident from the vertical sectional nature of the views constituting the drawing, emitter regions 16 preferably are shaped to show in plan view the usual interdigitated or equivalent emitter and base outline. The net surface impurity concentration of the emitters 16 is preferably about $7 \times 10^{19}$ impurity atoms per cc.

Following formation in wafer 2 of the N+ outer collector layer 4, the P+ base layer 10, and the various N+ emitter regions 16, all as above described, the resulting structure appears as shown in FIG. 4. According to the present invention the junction wafer 2 is then specially reinforced to facilitate further processing and handling, by mounting or laminating junction wafer 2 onto a semiconductor substrate or carrier wafer 24, which is preferably monocrystalline semiconductor material of the same chemical composition as wafer 2.

The carrier wafer 24 preferably has about the same thickness as the original thickness of wafer 2, and serves as a mechanical support and backing for the junction wafer 2, as well as suitably reinforcing it for further processing and handling with minimum damage or losses, as will hereinafter be described. Because the various portions of carrier wafer 24 are intended ultimately to be permanently physically associated with the bottom parts of the collector regions of the individual transistors of wafer 2, to preclude any undesired increase in collector saturation voltage the carrier wafer 24 preferably has a very low resistivity of, for example, 0.001 ohm-centimeters, and may be of either N or P type impurity.

To accomplish the attachment of carrier wafer 24 to junction wafer 2, one major face of carrier wafer 24 is provided with a metallic bonding coating 26 of a metal or metallic mixture capable of being readily alloyed with, or fused to, the semiconductor material of both the carrier wafer 24 and junction wafer 2. The choice of a suitable bonding metal is governed by the consideration that the eutectic temperature of the bonding metal 26 and the semiconductor material of wafers 2 and 24 must not exceed the diffusion temperature of the conductivity-determining impurities in layers 4 and 10, and must not be appreciably lower than the temperatures involved in certain passivant application steps which will hereinafter be described. When the semiconductor material of wafers 2 and 24 is silicon, suitable bonding metals for coating 26 include silver, palladium, aluminum and alloys or mixtures including such metals, and a preferred metal for this purpose is aluminum. The coating 26 may be applied to carrier wafer 24 in any desired fashion, such as by evaporation, and preferably should have a thickness as shown in FIG. 5 of about 0.4 mils. If desired, though it is not necessary, a similar coating may be applied to the bottom face of wafer 2 exposed by removal of oxide layer 6.

In bonding wafer 2 to wafer 24, wafer 2 is stacked or superimposed on the bonding metal-coated major face of carrier wafer 24, with layer 4 adjacent coating 26, and the wafers are preferably pressed together by a weight or the like affording a pressure of about 1 pound per square inch. The superimposed wafers are then subjected to a heat treatment, for example in a tunnel oven, at a temperature of about 700°C for about 20 minutes. The heat treatment fuses the coating 26 and forms an alloy region 28, consisting essentially of a fused mixture of the semiconductor material and the metal or metals of the coating 26, between the confronting major faces of the two wafers 2, 24. Depending on the extent to which the coating 26 dissolves in the wafers 2 and 24 during this thermal fusion treatment, a part of the thickness of original coating 26 may survive between separate respective alloy layers 28' and 28'' in wafers 2 and 24 as shown in FIG. 6, or all of coating 26 may be dissolved in the semiconductor material to form only a single-layer or unitary alloy region 28. In either event, alloy region 28 permanently and uniformly unites the two silicon wafers 2 and 24 throughout the area of their confronting major faces, with a bond of desirably low electrical and thermal resistance.

Following the attachment of junction wafer 2 to carrier wafer 24, the resulting composite structure is treated to partially subdivide wafer 2 into individual transistor regions, as will now be described. For this purpose, as shown in FIGS. 6 and 7, the exposed major face of the diffusion wafer 2 is coated with a suitable etch resist 32, such as a mask of apiezon or other suitable wax, patterned to form streets 34 exposing the silicon oxide mask 20 at locations between adjacent emitter regions 16. The exposed portions of the oxide 20 and the underlying portions of wafer 2 are then etched to form grooves 36. Suitable etchants for the oxide and underlying semiconductor material are well known. For example, dilute hydrofluoric acid is suitable for etching through the oxide 20, and when the underlying material is silicon a standard formulation such as CP6 or other conventional silicon-etching mixture of hydrofluoric and nitric acid is satisfactory. As a result of their formulation by etching, the grooves 36 are somewhat tapered in cross-section and have outwardly and slightly upward concave sidewalls, as best shown in FIG. 7. In accordance with the invention, grooves 36 are etched to a depth extending almost all the way through the junction wafer 2, such that the bottom of each groove 36 lies part way through the layer 4, leaving unetched only a portion of layer 4, of a thickness about 1 to 2 mils, sufficient to space and isolate the groove bottoms slightly from alloy region 28. Even though grooves 36 are etched almost all the way through wafer 2, so that the unetched portions of wafer 2 beneath the grooves 36 would be of themselves incapable of holding the wafer 2 together for further processing and handling, nevertheless carrier wafer 24 provides effective support for wafer 2 and the entire composite structure, and preserves all the remaining portions of wafer 2 in desired relation for further treatment as hereinafter described.

The grooves 36 expose the sidewalls of respective mesa-shaped regions 40 in the junction wafer 2, each such mesa region 40 being intended to constitute ultimately a portion of an individual transistor when the laminated composite of wafers 2 and 24 is finally completely subdivided as will hereinafter be described. Grooves 36 uncover, in each such mesa 40, both the periphery of the interface between inner collector layer 12 and outer collector layer 4 as well as the periphery of the P/N junction between base layer 10 and layer 2. The spacing between the bottom of each groove 36 and alloy region 28 prevents the etchant from back-plating or otherwise undesirably contaminating the mesa sidewalls during the groove-formation process.

Permanent protection, sealing, and passivation of the sidewalls of the individual mesas 40, including the exposed periphery of each individual collector-base junction 14 and the periphery of the exposed interface between layer 2 and layer 4 in each mesa, is then provided by application of a relatively thick coating or layer 44 of a glass passivant on each mesa sidewall. According to the present invention, all of the mesas are coated with passivant 44 simultaneously, before subdivision from the wafer stage, for optimum uniformity and economies of scale. One exemplary glass passivant application process, suitable for simultaneously applying a passivating glass coating to all of the individual mesas of a wafer, is the electrophoretic glass application process described in detail in U.S. Pat. No. 3,642,597, issued Feb. 15, 1972 and assigned to the assignee of the present invention. Briefly, that patent describes a process in which passivating glass of suitable composition having a dielectric strength of at least 100 to 500 volts per mil and up, and having an insulative resistance of at least $10^{10}$ ohm cm. as well as desirable thermal coefficient, is provided in the form of fine particles suspended in a liquid bath and deposited electrophoretically on selected target surfaces of a substrate immersed in the bath. After the electrophoretic glass coating is deposited, it is air-dried and fired to coalesce the particles into a cohesive nonparticulate mass, all as described in detail in U.S. Pat No. 3,642,597.

Following coating of the sidewalls of grooves 36 with the glass passivant 44, emitter and base contact windows are photolithographically opened in the silicon oxide masking layer 20 on top of each individual transistor mesa region, and an emitter contact 50 and base contact 52 is applied to each mesa region by conventional techniques. Where the semiconductor material of wafer 2 is silicon, such emitter and base contacts may be, for example, aluminum, evaporated or otherwise deposited to a thickness of about 0.2 mils. The exterior major face of the carrier wafer 24 is then provided with a suitable collector contact metallization 56, which may be, for example, silver-over-nickel-over-chromium, applied for example by evaporation techniques known to those skilled in the art. The resulting composite structure, as best shown in FIG. 8, is then segmented into individual power transistor pellets by subdivision along separation faces as indicated at 62, for example by slurry sawing through the glass region 44 adjacent the bottom of each groove 36 and the underlying portion of carrier wafer 24. The individual transistor pellets may then, if desired, be provided with suitable external leads, not shown, and enclosed in a protective housing such as a conventional hermetic metal can package having relatively stiff external leads, or a plastic encapsulant or other suitable protective enclosure as desired.

Transistors, and the manufacture thereof, according to the present invention have a number of advantages. As will be evident from the above description, the carrier wafer 24 serves to hold all the individual transistor mesa regions 50 together during and after the etching of grooves 36 even though the grooves 36 are etched so deeply into the junction wafer 2 that the remaining unetched portion of layer 4 of wafer 2 would be too thin and too fragile to permit handling and processing of wafer 2 alone. The layer 4, having a relatively high impurity concentration, precludes any possibility of the bonding metal 26 or alloy region 28 undesirably modifying the conductivity type of the transistor collector regions. The carrier wafer 24, though of a desirably low electrical resistivity so as to have an insignificant effect on $V_{CE_{SAT}}$, forms a good thermal match with the junction wafer 2 for minimum thermally induced stresses during processing, and also acts as a stress buffer between the junction wafer 2 and any metallic member to which the bottom face of wafer 24 may ultimately be mounted. Though carrier wafer 24 is easily segmented during the steps of subdivision along loci 62, the reinforcement and support it provides to junction wafer 2 facilitates batch-passivation of all of the individual transistor mesa regions 40 at the same time, before subdivision, with the resulting advantages of process uniformity, high yields, and minimized cost. Moreover, the individual transistors can be individually electrically probed and tested before subdivision of the composite wafer structure or any encapsulation or housing thereof. Thus it will be evident that the present invention provides an improved power transistor manufacturing process, and resulting product, in which permanently glass-passivated junctions of superior voltage blocking characteristics are readily attained, yet all the economic and cost minimizing advantages of complete fabrication and processing of the transistors in wafer form are preserved. The result is a power transistor of superior performance, yet of a cost compatible with the needs of the consumer and industrial markets.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What we claim as new and desire to secure by Letters Patent of the United States is:

1. In a method of making power transistors, to steps of a. providing a junction wafer of monocrystalline silicon containing in stacked relation an outer collector layer of relatively low resistivity exposed at the bottom major face of said junction wafer, an inner collector layer of relatively high resistivity surmounting said outer collector layer, a base layer surmounting said inner collector layer and defining therewith a base-collector P/N junction, and an array of spaced emitter regions on said base layer and defining with said base layer the top major face of said junction wafer;

b. stacking said junction wafer on a silicon carrier wafer with the opposed major faces of said wafers separated by a metallic alloy bonding layer, subjecting the resulting stack to a thermal treatment to form a metallic alloy bond uniting the opposed major faces of the junction wafer and carrier wafer;

c. forming, between the emitter regions in the exposed top major face of the junction wafer, a family of grooves having a depth extending part way through said outer collector layer and defining a plurality of mesas in said junction wafer with each of said mesas including a portion of said outer collector layer surmounted by a portion of said inner collector layer topped by a base region and an emitter region; and d. providing a coating of glass passivating material on the sidewalls and bottoms of said grooves and covering the exposed edges of the interfaces between the base and inner collector region in each mesa and the inner collector and outer collector region in each mesa, whereby said wafer stack may be subdivided into individual transistor bodies at separation faces extending generally normal to the major faces of said wafers along the bottoms of said grooves, said step of providing glass material comprising the substeps of depositing glass frit in said grooves and heating said stack to fuse said glass frit.

2. The method defined in claim 1 wherein said grooves are formed by etching, whereby the sidewalls of the mesas formed by said grooves are outwardly and upwardly concave.

3. The method defined in claim 2 wherein said metallic alloy bonding layer comprises aluminum.

4. The method defined in claim 3 further comprising the step of subdividing said stack into a plurality of transistor bodies along the bottoms of said grooves.

5. The method defined in claim 4 wherein said step of providing a coating of glass passivating material comprises electrophoresis.

6. In a method of making power transistors, the steps of a. providing a junction wafer of monocrystalline silicon containing in stacked relation an outer collector layer of relatively low resistivity exposed at the bottom major face of said junction wafer, an inner collector layer of relatively high resistivity surmounting said outer collector layer, a base layer surmounting said inner collector layer and defining therewith a base-collector P/N junction, and an array of spaced emitter regions on said base layer and defining with said base layer the top major face of said junction wafer;

b. stacking said junction wafer on a silicon carrier wafer with the opposed major faces of said wafers separated by an aluminum alloy bonding layer, subjecting the resulting stack to a thermal treatment to form an aluminum alloy bond uniting the opposed major faces of the junction wafer and carrier wafer;

c. etching, between the emitter regions in the exposed top major face of the junction wafer, a family of grooves having a depth extending part way through said outer collector layer and defining a plurality of mesas in said junction wafer with each of said mesas including a portion of said outer collector layer surmounted by a portion of said inner collector layer topped by a base region and an emitter region;

d. providing a coating of glass passivating material on the sidewalls and bottoms of said grooves and covering the exposed edges of the interfaces between the base and inner collector region in each mesa and the inner collector and outer collector region in each mesa, said step of providing glass material comprising the substeps of depositing glass frit in said grooves and heating said stack to fuse said glass frit; and e. subdividing said wafer stack into individual transistor bodies at separation faces extending generally normal to the major faces of said wafers along the bottoms of said grooves.

* * * * *